(12) United States Patent
Kim

(10) Patent No.: US 8,106,704 B2
(45) Date of Patent: Jan. 31, 2012

(54) APPARATUS AND METHOD FOR PREVENTING EXCESSIVE INCREASE IN PUMPING VOLTAGE WHEN GENERATING PUMPING VOLTAGE

(75) Inventor: Myung Jin Kim, Suwon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/344,650

(22) Filed: Dec. 29, 2008

(65) Prior Publication Data

US 2009/0195299 A1    Aug. 6, 2009

(30) Foreign Application Priority Data

Feb. 4, 2008    (KR) .................. 10-2008-0011381

(51) Int. Cl.
*G05F 1/10* (2006.01)
*G05F 3/02* (2006.01)

(52) U.S. Cl. ........... 327/537; 327/536; 327/535; 363/60

(58) Field of Classification Search .................. 327/148, 327/157, 534–537; 363/59, 60
See application file for complete search history.

(56) References Cited

U.S. PATENT DOCUMENTS

| | | | |
|---|---|---|---|
| 5,526,253 A * | 6/1996 | Duley | 363/59 |
| 6,111,791 A * | 8/2000 | Ghilardelli | 365/185.28 |
| 6,297,991 B1 * | 10/2001 | Ozoe | 365/185.23 |
| 6,687,159 B2 * | 2/2004 | Pasotti et al. | 365/185.18 |
| 6,724,241 B1 * | 4/2004 | Bedarida et al. | 327/536 |
| 2002/0101277 A1 * | 8/2002 | Choi | 327/536 |
| 2005/0249022 A1 * | 11/2005 | Martines et al. | 365/230.06 |
| 2006/0114721 A1 * | 6/2006 | Frulio et al. | 365/185.18 |
| 2007/0115044 A1 * | 5/2007 | Chan et al. | 327/540 |
| 2009/0027110 A1 * | 1/2009 | Lee | 327/538 |

FOREIGN PATENT DOCUMENTS

KR    20080003048 A    1/2008

* cited by examiner

*Primary Examiner* — Lincoln Donovan
*Assistant Examiner* — Brandon S Cole
(74) *Attorney, Agent, or Firm* — Ladas & Parry LLP

(57) ABSTRACT

A device for generating a pumping voltage and preventing an excessive increase in the pumping voltage includes a pumping voltage output unit that outputs a pumping voltage and adjusts the level of the pumping voltage in order to maintain a target voltage. The level of the pumping voltage is adjusted in response to a change in the level of the pumping unit. A release unit is included to detect an excessive pumping voltage. The release unit adjusts the level of the pumping voltage when the pumping voltage reaches a predetermined excessive level by compulsively decreasing the pumping voltage to prevent damage in the DRAM.

14 Claims, 6 Drawing Sheets

APPARATUS AND METHOD FOR PREVENTING EXCESSIVE INCREASE IN PUMPING VOLTAGE WHEN GENERATING PUMPING VOLTAGE

This application claims the benefit of priority to Korean Patent Application No. 10-2008-0011381, filed on 4 Feb. 2008, the entire contents of which are incorporated herein by reference.

BACKGROUND OF THE INVENTION

The present invention generally relates generally to an apparatus for generating an internal voltage of a semiconductor device, and more particularly, to an apparatus and a method for generating a pumping voltage which prevent an excessive increase of the pumping voltage so that a regular level of the pumping voltage is maintained.

FIG. 1 is a diagram showing a conventional apparatus for generating a pumping voltage. The conventional apparatus has an oscillator 10, a charge pumping unit 20 and a level detecting unit 30.

The oscillator 10 operates in response to a pumping enable signal ppe received from the level detecting unit 30. The oscillator 10 generates a pulse signal osc having a given cycle when the pumping enable signal ppe is activated making the pumping enable signal ppe a high level. When the pumping enable signal ppe is activated, the oscillator outputs the pulse signal osc to the charge pumping unit 20.

The charge pumping unit 20 generates a pumping voltage VPP in response to the pulse signal osc. The level detecting unit 30 detects the level of the pumping voltage VPP by comparing the pumping voltage VPP with a reference voltage VREF, and activates the pumping enable signal ppe according to the detected level of the pumping voltage VPP.

The conventional apparatus operates as follows. The level detecting unit 30 detects the level of the pumping voltage VPP (which is received from the charge pumping unit 20) and compares the pumping voltage VPP to the reference voltage VREF. When the pumping voltage VPP is lower than the reference voltage VREF, the pumping enable signal ppe is activated at a high level and is output to the oscillator 10.

When the pumping enable signal ppe is activated (i.e., a high level) the oscillator 10 generates the pulse signal osc and outputs the pulse signal osc to the charge pumping unit 20. The charge pumping unit 20 gradually raises the level of the pumping voltage VPP until the pumping voltage VPP reaches a predetermined level in each high level period of the pulse signal osc. When the pumping voltage VPP reaches the predetermined level, the level detecting unit 30 deactivates the pumping enable signal ppe so that it is a low level in order to stop generation of the pulse signal osc. As a result, the increase in the pumping voltage stops.

The conventional apparatus described above is designed to maintain a predetermined DC level of the pumping voltage VPP during the general operation of a dynamic random access memory (DRAM).

However, electrostatic discharge from current flow-in or from a pad and the noise effect of an external supply power VDD cause the level of the pumping voltage VPP to be higher than the target level by what can be considered an excessive amount.

When the excessively high pumping voltage is supplied to a gate of a transistor through a word line, the gate oxide film between the gate and the bulk deteriorates due to the excessive bias, and thereby the operational characteristics of the DRAM diminish, as shown in FIG. 2.

SUMMARY OF THE INVENTION

Aspects of the present invention include an apparatus and a method for generating a pumping voltage.

According to an aspect of the present invention, an apparatus for generating a pumping voltage includes a pumping voltage output unit configured to output a pumping voltage and adjust a level of the pumping voltage depending on a detection result of a change in the level of the pumping voltage, thereby maintaining a target level of the pumping voltage; and a release unit configured to adjust the level of the pumping voltage when the pumping voltage reaches a predetermined excessive level.

The pumping voltage output unit includes a level detecting unit configured to detect the level change of the feed-back pumping voltage, thereby selectively activating a pumping enable signal; an oscillator configured to output a pulse signal having a given cycle when the pumping enable signal is activated; and a charge pumping unit configured to pump the pumping voltage to the target level in response to the pulse signal.

The release unit includes a comparing unit configured to detect the level of the pumping voltage, thereby selectively activating a sink signal; and a sink unit configured to decrease the level of the pumping voltage when the sink signal is activated.

The release unit further includes a pumping voltage dividing unit configured to divide the pumping voltage into a given size, thereby outputting the divided voltage to the comparing unit.

The sink unit includes at least one switching element configured to be turned-on when the sink signal is activated, thereby decreasing the level of the pumping voltage.

The sink unit includes a main sink unit configured to down the level of the pumping voltage when the sink signal is activated; and at least one subsidiary sink unit configured to selectively receive the sink signal, thereby selectively downing the level of the pumping voltage.

According to an embodiment of the present invention, a method for generating a pumping voltage includes steps of detecting a change in the level of a feed-back pumping voltage; and adjusting the level of the pumping voltage when the pumping voltage reaches a predetermined excessive level.

The step of detecting a change in the level of the feed-back pumping voltage includes dividing the pumping voltage into a given size; and comparing a level of the divided voltage with that of a reference voltage.

The step of adjusting a level of the pumping voltage includes decreasing the level of the pumping voltage when the level of the divided voltage is larger than that of the reference voltage.

DESCRIPTION OF SPECIFIC EMBODIMENTS

The present invention will now be described in detail with reference to the accompanying drawings.

Figure 1:
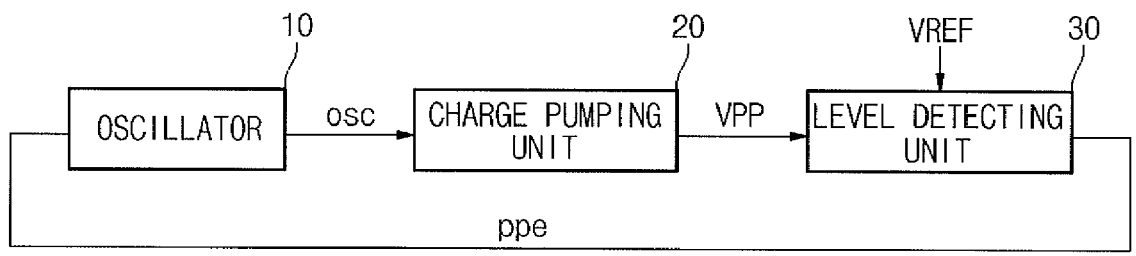
FIG. 1 is a diagram showing a conventional apparatus for generating a pumping voltage.
Figure 2:
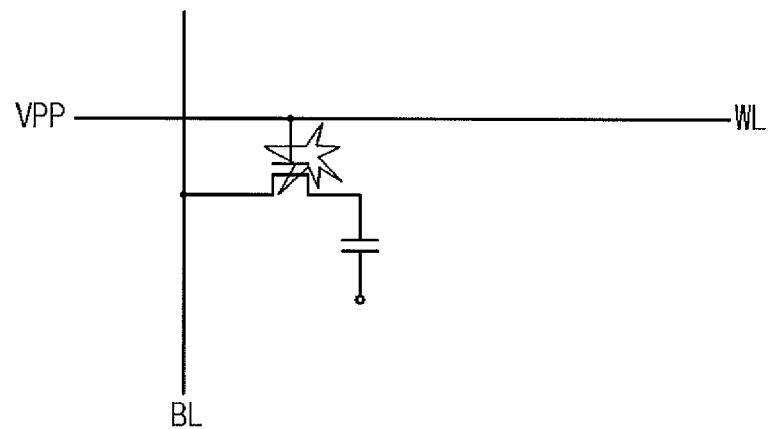
FIG. 2 is a diagram showing the deterioration of a gate oxide film caused by excessive pumping voltage.
Figure 3:
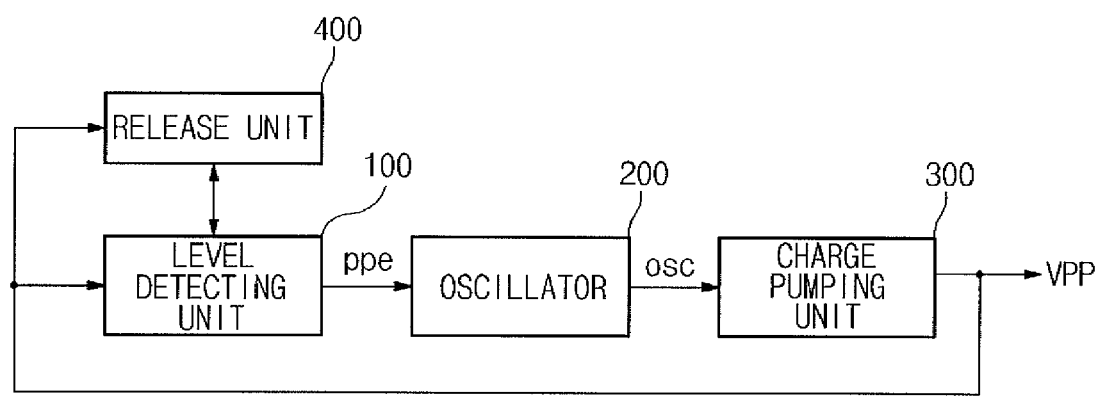
FIG. 3 is a diagram showing an apparatus for generating a pumping voltage according to an embodiment of the present invention.

FIG. 3 is a diagram showing an apparatus for generating a pumping voltage according to an embodiment of the present invention. The apparatus comprises a level detecting unit 100, an oscillator 200, a charge pumping unit 300 and a release unit 400.

The level detecting unit 100 detects the level of a pumping voltage VPP received from the charge pumping unit 300 and selectively activates a pumping enable signal ppe according to the result of the detection. More specifically, the level detecting unit 100 compares a reference voltage VREF1 to the pumping voltage VPP received from the charge pumping unit 300, and selectively activates the pumping enable signal ppe. For example, the level detecting unit 100 activates the pumping enable signal ppe making the pumping enable signal ppe a high level when the voltage level of the pumping voltage VPP (or, for example, a voltage obtained by dividing the pumping voltage VPP) is lower than the reference voltage VREF1, and deactivates the pumping enable signal ppe making the pumping enable signal ppe a low level when the pumping voltage VPP (or, for example, a voltage obtained by dividing the pumping voltage VPP) is higher than the reference voltage VREF1.

The oscillator 200 generates a pulse signal osc having a given cycle when the pumping enable signal ppe is activated, and outputs the pulse signal osc to the charge pumping unit 300.

The charge pumping unit 300 pumps the pumping voltage VPP in response to the pulse signal osc in order to maintain the pumping voltage VPP at a target level. That is, when the level of the pumping voltage VPP is low, the charge pumping unit 300 pumps Is the pumping voltage VPP in response to the pulse signal osc until the pumping voltage VPP reaches the target level, thereby gradually raising the pumping voltage VPP to the target level.

The release unit 400 detects a change in the level of the pumping voltage VPP, and compulsively decreases (i.e., forcefully causing the pumping voltage VPP to decrease, for example, a sharp decrease by grounding) the level of the pumping voltage VPP when the level of the pumping voltage VPP reaches a predetermined excessive level. The release unit 400 compares a reference voltage to the pumping voltage (or, for example, a voltage obtained by dividing the pumping voltage VPP) received from the charge pumping unit 300. As a result, when the pumping voltage VPP reaches an excessive level, the pumping voltage is grounded to compulsively decrease the voltage level.

Although the level detecting unit 100, the oscillator 200 and the charge pumping unit 300 are explained as separate structures for convenience, they may be constructed as one pumping output unit. In an embodiment of the present invention, the reference voltages VREF1 and VREF2 may be the same size.

Figure 4:
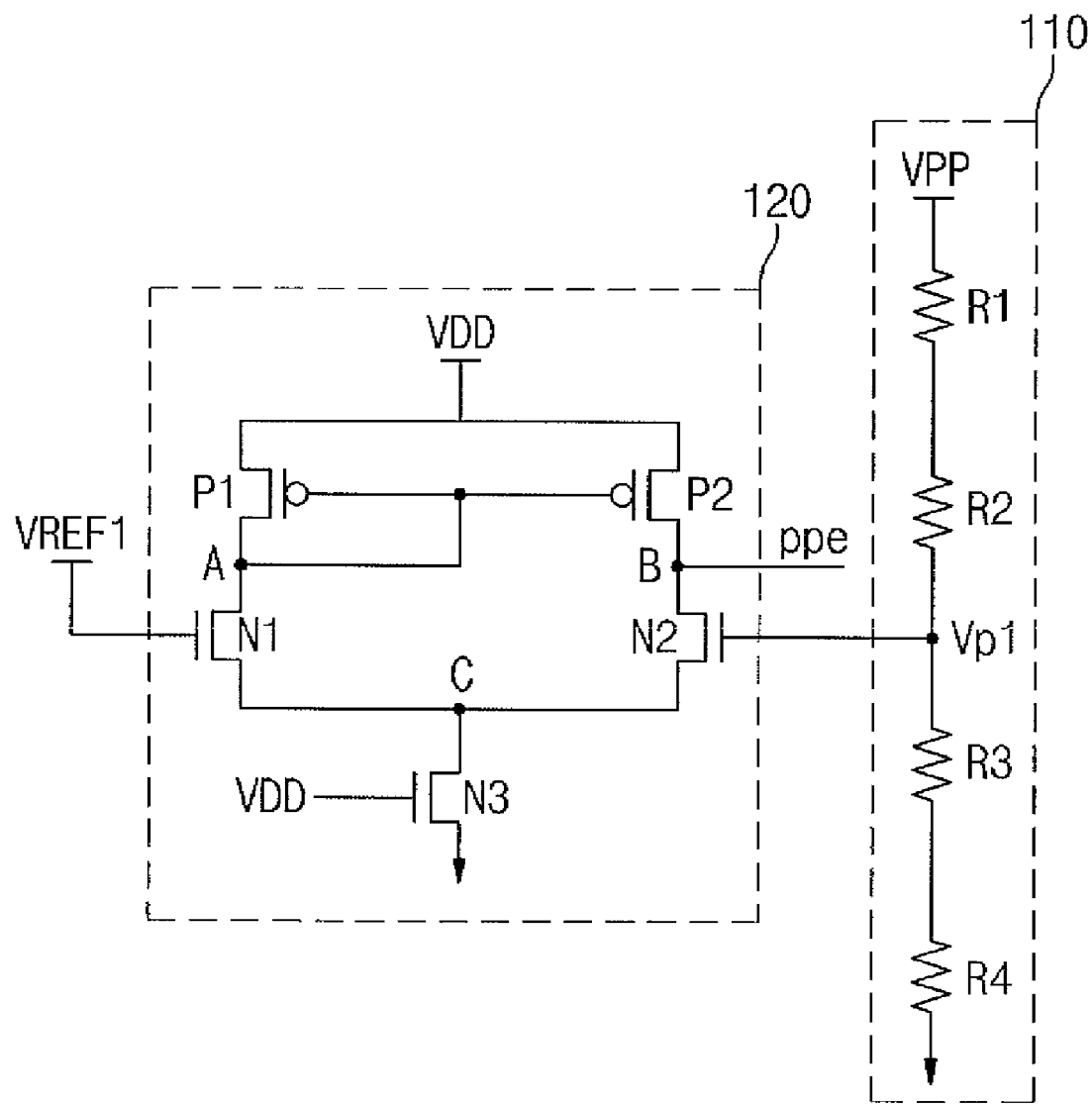
FIG. 4 is a circuit diagram showing the level detecting unit of the apparatus shown in FIG. 3.

FIG. 4 is a circuit diagram showing an embodiment of the level detecting unit 100 of the apparatus shown in FIG. 3. The level detecting unit 100 of FIG. 3 comprises a pumping voltage dividing unit 110 and a comparing unit 120.

The pumping voltage dividing unit 110 divides the pumping voltage VPP into a given size. A divided voltage VP1 is outputted to the comparing unit 120. Resistors R1~R4 are connected in series between the pumping voltage VPP and a ground voltage in the pumping voltage dividing unit 110.

Referring to FIG. 4, the size of the voltage VP1 outputted by the pumping voltage dividing unit 110 is: VP1=VPP×((R3+R4)/(R1+R2+R3+R4)). Although the voltage VP1 obtained by dividing the pumping voltage VPP is used as an input voltage in the embodiment shown in FIG. 4, the output voltage VPP can also be used as an input voltage of the comparing unit 120 without division.

The comparing unit 120 compares the reference voltage VREF1 to the output voltage VP1 of the pumping voltage dividing unit 110. When the voltage VP1 is lower than the reference voltage VREF1, the pumping enable signal ppe is activated at a high level. Conversely, when the voltage VP1 is higher than the reference voltage VREF1, the pumping enable signal ppe is deactivated at a low level.

The comparing unit 120 comprises PMOS transistors P1, P2 and NMOS transistors N1~N3. The PMOS transistor P1 is connected between a driving voltage VDD input terminal and node A. The PMOS transistor P2 is connected between the driving voltage VDD input terminal and node B. The gates of the PMOS transistors P1, P2 are connected in common to node A. The NMOS transistor N1 is connected between node A and node C, and the gate of the NMOS transistor N1 receives the reference voltage VREF1. The NMOS transistor N2 is connected between node B and node C, and the gate of the NMOS transistor N2 receives the voltage VP1 from the pumping voltage dividing unit 110. The NMOS transistor N3 is connected between node C and the ground voltage, and the gate of the NMOS transistor N3 receives the driving voltage VDD.

The level detecting unit 100 operates as follows. When the voltage level of the pumping voltage VPP outputted from the charge pumping unit 300 is lower than a target value, the voltage VP1 outputted from the pumping voltage dividing unit 110 is lower than the reference voltage VREF1. As a result, the amount of current flowing through the NMOS transistor N1 is larger than that of the current flowing through the NMOS transistor N2, and node A is converted into a low level. When node A is at the low level, the PMOS transistor P2 is turned on, and the node B is converted into a high level. Thereby, the pumping enable signal ppe is activated at the high level.

When the pumping enable signal ppe is activated, the voltage level of the pumping voltage VPP is gradually increased, and therefore the voltage level of the voltage VP1 outputted by the pumping voltage dividing unit 110 gradually increases until it is higher than the reference voltage VREF1. When the voltage VP1 is higher than the reference voltage VREF1, the amount of current flowing through the NMOS transistor N2 is larger than that of the current flowing through the NMOS transistor N1, and node B is converted into a low level. When node B is at the low level, the pumping enable signal ppe is converted into the low level and is thus deactivated.

Figure 5:
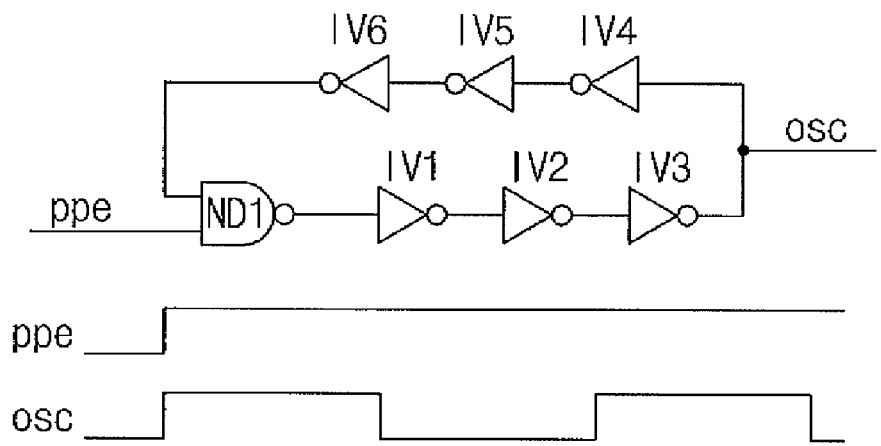
FIG. 5 is a circuit diagram showing the oscillator of the apparatus shown in FIG. 3.

FIG. 5 is a circuit diagram showing an embodiment of the oscillator 200 of the apparatus shown in FIG. 3.

The oscillator 200 comprises a NAND gate ND1 and inverters IV1~IV6. The NAND gate ND1 performs a NAND logical operation on the pumping enable signal ppe and a delayed feed-back signal. The inverters IV1~IV6 are connected in series between an output terminal of the oscillator 200 and an input terminal of the NAND gate ND1 with a ring shape.

The oscillator 200 generates the pulse signal osc (which has a given cycle) when the pumping enable signal ppe is activated at the high level, thereby outputting the pulse signal osc to the charge pumping unit 300. The pulse width and cycle of the pulse signal osc is dependent upon the number of inverters.

Figure 6:
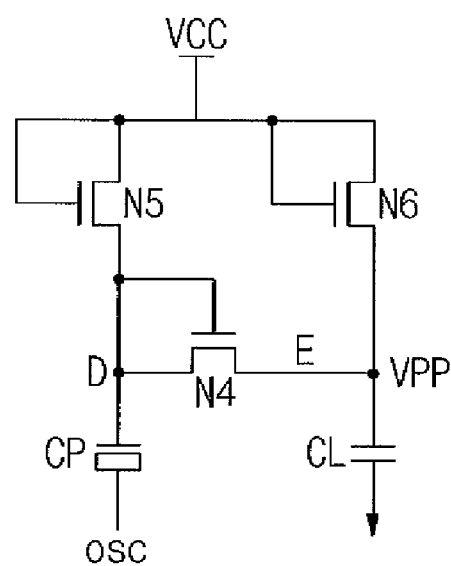
FIG. 6 is a circuit diagram showing the charge pumping unit of the apparatus shown in FIG. 3.

FIG. 6 is a circuit diagram showing an embodiment of the charge pumping unit 300 of the apparatus shown FIG. 3. The charge pumping unit 300 comprises NMOS transistors N4~N6, a pumping capacitor CP and a load capacitor CL.

The NMOS transistor N4 is connected between nodes D and E, and the gate of the NMOS transistor N4 is connected to node D. The NMOS transistor N5 is connected between a power voltage VCC input terminal and node D, and the gate of the NMOS transistor N5 is connected to the power voltage VCC input terminal. The NMOS transistor N6 is connected between the power voltage VCC and node E, and the gate of the NMOS transistor N6 is connected to the power voltage VCC input terminal. The pumping capacitor CP is connected between node D and a pulse signal osc input terminal. The load capacitor CL is connected between node E and a ground voltage terminal. The capacitance of the load capacitor CL is larger than that of the pumping capacitor CP.

Figure 7:
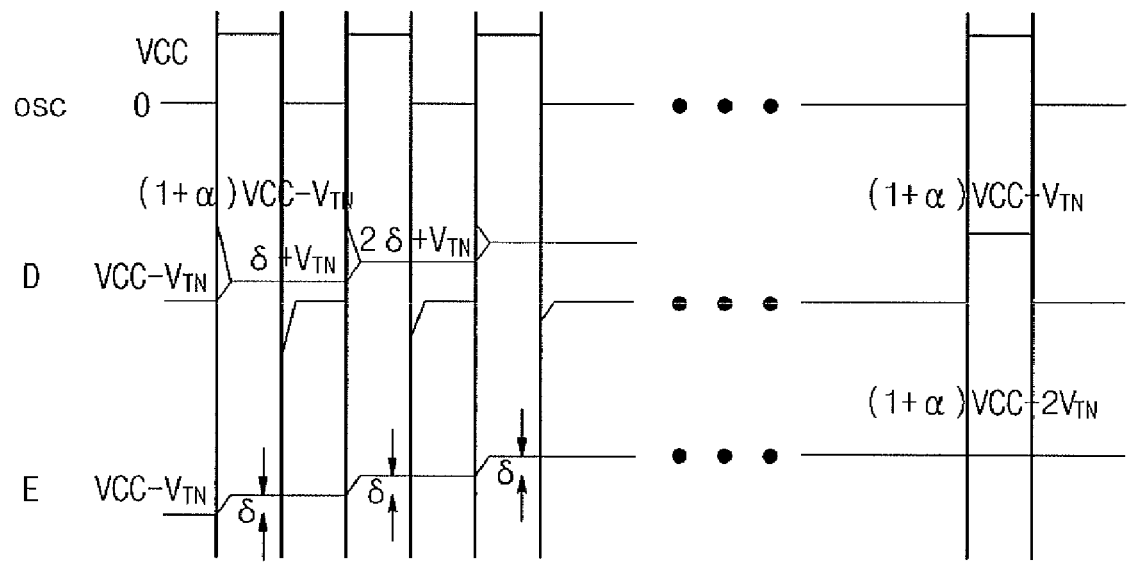
FIG. 7 is a timing diagram shown for illustrating a charge pumping unit according to an embodiment of the present invention.

FIG. 7 is a timing diagram shown for illustrating the operation of the charge pumping unit according to an embodiment of the present invention. Referring to FIG. 7, while the pulse signal osc is not applied, the nodes D and E are charged with VCC−Vtn by the NMOS transistors N5 and N6. When the pulse signal osc is inputted to the input terminal, the potential of the node D is boosted by αVCC (α is boosted by a boosting rate to be VCC−Vtn+αVCC). As a result, the NMOS transistor N4 is turned on, and charges are charged in the load capacitor CL. That is, through the pumping capacitor CP, a part of the charges inputted to the node D is transmitted to the node E, and charges are charged in the load capacitor CL.

However, since the capacitor of the load capacitor CL is larger than that of the pumping capacitor CP, a voltage (δ) charged in the node E is small. When the voltage of the node E rises and the voltage difference between the nodes D and E is Vtn, the NMOS transistor N4 is turned off, and the charging stops.

When the supply of the pulse signal osc stops, the potential of node D falls below VCC−Vtn. However, the potential is recharged by the NMOS transistor N5, and recovers to VCC−Vtn. Whenever the pulse signal osc is supplied to the input terminal, node E is charged, and the voltage rises. As a result, the voltage level of the node E is (1+α)VCC−2Vtn.

The voltage level is maintained by charges stored in the load capacitor CL, and falls when charges are lost. The NMOS transistor N4 is turned on, and charges are inputted in the load capacitor CL to recover the voltage level. The time at which the pumping voltage VPP reaches a stable voltage level is determined by the size rate of the pumping capacitor CP and the load capacitor CL and by the frequency of the pulse signal osc.

Figure 8:
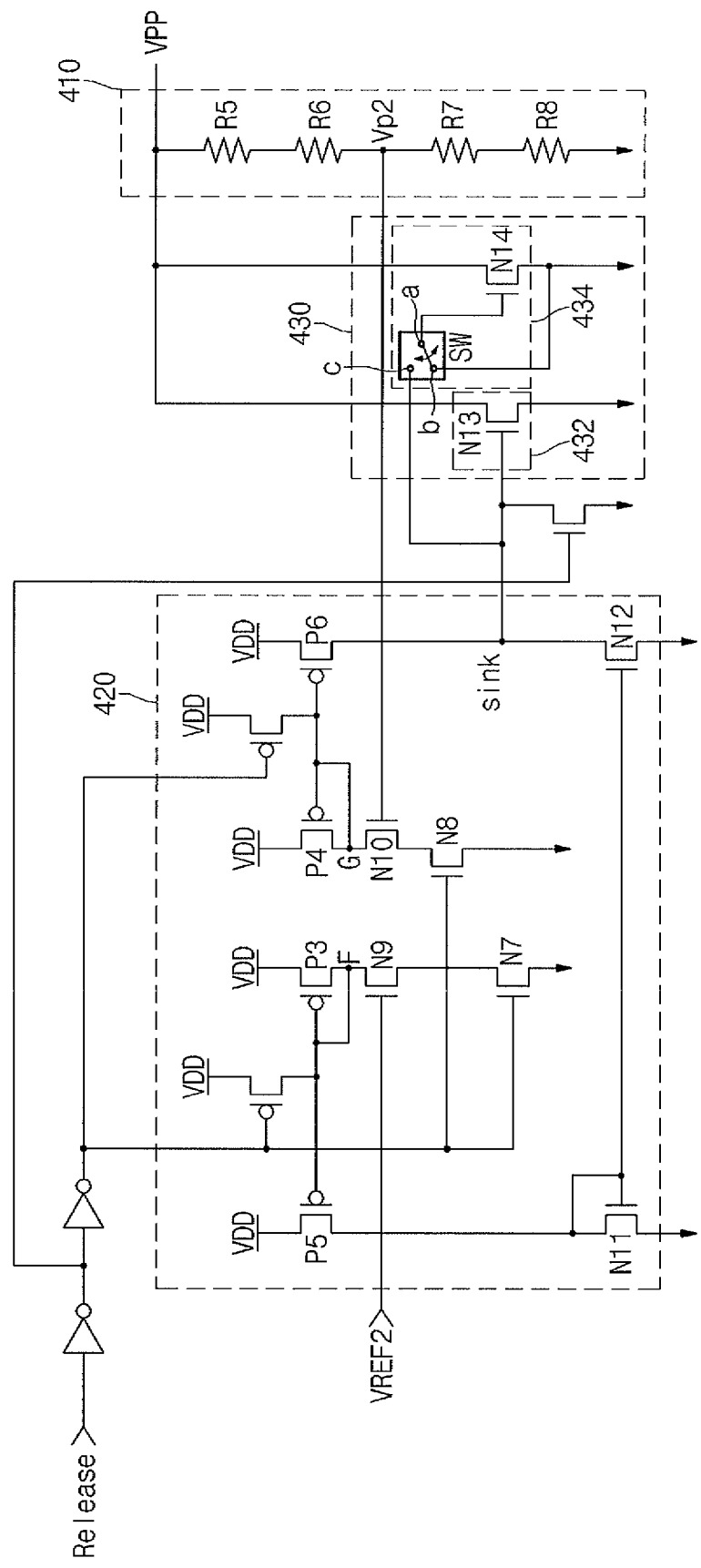
FIG. 8 is a circuit diagram showing the release unit of the apparatus shown in FIG. 3.

FIG. 8 is a circuit diagram showing an embodiment of the release unit 400 of the apparatus shown in FIG. 3. The release unit 400 comprises a pumping voltage dividing unit 410, a comparing unit 420 and a sink unit 430.

The pumping voltage dividing unit 410 divides the pumping voltage VPP into a given size and outputs a divided voltage VP2 to the comparing unit 420. Resistors R5~R8 are connected in series between the pumping voltage VPP and a ground voltage.

Although the voltage VP2 (which is obtained by dividing the pumping voltage VPP into a given size) is used as the input voltage of the comparing unit 420 in the embodiment shown in FIG. 8, the output voltage VPP, which is not divided, may be used as an input voltage of the comparing unit 420.

The size of the voltage VP2 outputted from the pumping voltage dividing unit 410 is set to be lower than the voltage of the output voltage VP1 of the pumping voltage dividing unit 110. Since the present invention prevents the pumping voltage from being higher than a target level by an excessive amount, the comparing unit 420 receives the voltage VP2, which is lower than the output voltage VP1 of the pumping voltage dividing unit 110, in order to detect the excessive pumping voltage.

However, it is possible for the voltage VP2 to be the same as the voltage VP1. Otherwise, the level of the reference voltage VREF2 applied to the release unit 400 should be higher than the reference voltage VREF1 applied to the level detecting unit 100.

The comparing unit 420 compares the reference voltage VREF2 to the voltage VP2 received from the pumping voltage dividing unit 410. When the size of the voltage VP2 is larger than that of the reference voltage VREF2, that is, when the pumping voltage VPP reaches a predetermined excessive level, the comparing unit 420 outputs a sink signal SINK for decreasing the level of the pumping voltage VPP.

The comparing unit 420 comprises PMOS transistors P3~P6, and NMOS transistors N7~N12. The release signal Release shown in FIG. 8 is a signal used in a test mode, and maintains a high level when in normal mode.

The sink unit 430 grounds the pumping voltage VPP when the sink signal SINK is activated at a high level, thereby compulsively decreasing the pumping voltage VPP. The sink unit 430 comprises a main sink unit 432 and a subsidiary sink unit 434. The main sink unit 432 comprises an NMOS transistor N13 connected between the pumping voltage VPP terminal and the ground voltage input terminal. The gate of the NMOS transistor N13 receives the sink signal SINK.

The subsidiary sink unit 434 comprises an NMOS transistor N14 and a switching element SW. The NMOS transistor N14 is connected between the pumping voltage VPP terminal and the ground voltage input terminal, and the gate of the NMOS transistor is connected to the switching element SW. The sink signal SINK may be selectively connected to the gate of the NMOS transistor N14 by external manipulation of the switching element SW.

If, during testing (i.e., when the device is in test mode), it is found that it is difficult to decrease the pumping voltage VPP solely with the main sink unit 432, the subsidiary sink unit 434 can connect the NMOS transistor N14 in parallel to the main sink unit 432 in order to more rapidly decrease the pumping voltage VPP.

That is, when a desired decrease in the pumping voltage can be obtained solely with the main sink unit 432, as shown in FIG. 8, terminal a is connected to terminal b. When the help of the subsidiary sink unit 434 is necessary, terminal a is connected to terminal c, so that the NMOS transistors N13 and N14 are each turned on with the sink signal SINK is activated. Also, if necessary, a plurality of the subsidiary sink units 434 can included in the sink unit 430.

The operation of the release unit 400 is as follows. The level detecting unit 100 divides the feed-back pumping voltage VPP, and compares the divided voltage VP1 to the reference voltage VREF1. When the voltage VP1 is larger than the reference voltage VREF1, (or when the pumping voltage VPP is the same or larger than the target level) the pumping enable signal ppe is deactivated at the low level.

Meanwhile, when the voltage VP1 is smaller than the reference voltage VREF1, that is, when the pumping voltage VPP is less than the target level, the pumping enable signal ppe is activated at the high level.

When the pumping enable signal ppe is activated, the oscillator 200 generates the pulse signal osc (which has a given cycle) and outputs the pulse signal osc to the charge pumping unit 300. When the pulse signal osc is applied, the charge pumping unit 300 pumps the pumping voltage VPP to raise the pumping voltage VPP to the target level.

If the pumping voltage VPP is maintaining the target level, the voltage VP2 is smaller than the reference voltage VREF2, and therefore the release unit 400 is not operated. That is, when the voltage VP2 is smaller than the reference voltage VREF2, the amount of current flowing through the NMOS transistor N9 is larger than that of current flowing through the NMOS transistor N10, and therefore node F is at a low level. The PMOS transistor P5 and the NMOS transistors N11, N12 are turned on. When the NMOS transistor N12 is turned on, the sink signal SINK is outputted at a low level state so that the pumping voltage VPP is not decreased.

As the apparatus for generating a pumping voltage maintains the pumping voltage VPP at the target level, if a current flows in from the outside, an electrostatic discharge (ESD) is generated from a pad, or a noise is included in the external supply voltage VDD, the amount of current flowing through the NMOS transistor N10 becomes larger than that of current flowing through the NMOS transistor N9. A voltage of the node F is then converted into the low level.

When the voltage of the node F is converted into the low level, the PMOS transistor P6 is turned on, and the sink signal SINK is converted into a high level. As a result, the NMOS transistor N13, which is the main sink unit 432, is turned on, and the pumping voltage VPP input terminal is connected to the ground voltage input terminal so that the voltage level of the pumping voltage VPP falls.

When the pumping voltage VPP is smaller than the target level, the pumping voltage VPP is pumped by the charge pumping unit 300 to raise the level, thereby recovering the target level.

When the switching unit SW connects terminal a to terminal c and the sink signal SINK is converted into the high level, the NMOS transistor N13 and N14 are turned on, thereby quickly decreasing the pumping voltage VPP.

As described above, the present invention prevents an excessive rise in the pumping voltage using the release unit 400 in the above-described operation, thereby improving the operation and reliability of the DRAM.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. An apparatus for generating a pumping voltage, the apparatus comprising:
 a pumping voltage output unit configured to output a pumping voltage and configured to adjust a level of the pumping voltage to maintain a target level of the pumping voltage, wherein the level of the pumping voltage is adjusted according to a change in the level of the pumping voltage; and
 a release unit configured to adjust the level of the pumping voltage when the pumping voltage reaches a predetermined excessive level which is greater than the target level by an excessive amount that is capable of causing deterioration to a gate of a transistor for receiving the pumping voltage,
 wherein the release unit comprises:
 a comparing unit configured to detect the level of the pumping voltage, and activate a sink signal when the pumping voltage reaches the excessive level; and
 a main sink unit configured to decrease the level of the pumping voltage when the sink signal is activated; and
 one or more subsidiary sink units configured to selectively receive the sink signal for selectively decreasing the level of the pumping voltage at a rate faster than the rate when only the main sink unit receives the sink signal.

2. The apparatus according to claim 1, wherein the pumping voltage output unit comprises:
 a level detecting unit configured to detect a change in the level the pumping voltage, and configured to selectively activate a pumping enable signal according to the result of the detection;
 an oscillator configured to output a pulse signal when the pumping enable signal is activated; and
 a charge pumping unit configured to raise the pumping voltage to the target level in response to the pulse signal.

3. The apparatus according to claim 1, further comprising a pumping voltage dividing unit configured to divide the pumping voltage and output the divided pumping voltage to the comparing unit.

4. The apparatus according to claim 1, wherein the sink unit comprises at least one switching element connected to a ground voltage terminal and configured to be turned-on when the sink signal is activated to decrease the level of the pumping voltage by connecting the pumping voltage to the ground voltage terminal.

5. An apparatus for generating a pumping voltage, the apparatus comprising:
 a pumping voltage output unit configured to output a pumping voltage and configured to adjust a level of the pumping voltage to maintain a target level of the pumping voltage, wherein the level of the pumping voltage is adjusted according to a change in the level of the pumping voltage; and
 a release unit configured to discharge the level of the pumping voltage to be grounded when the pumping voltage reaches a predetermined excessive level which is greater than the target level by an excessive amount that is capable of causing deterioration to a gate of a transistor for receiving the pumping voltage,
 wherein the release unit comprises:
 a comparing unit configured to detect the level of the pumping voltage, and activate a sink signal when the pumping voltage reaches the excessive level; and
 a main sink unit configured to decrease the level of the pumping voltage to be grounded when the sink signal is activated; and
 one or more subsidiary sink units configured to selectively receive the sink signal for selectively decreasing the level of the pumping voltage to be grounded at a rate faster than the rate when only the main sink unit receives the sink signal.

6. The apparatus according to claim 5, wherein the pumping voltage output unit comprises:
 a level detecting unit configured to detect a change in the level the pumping voltage, and configured to selectively activate a pumping enable signal according to the result of the detection;

an oscillator configured to output a pulse signal when the pumping enable signal is activated; and a charge pumping unit configured to raise the pumping voltage to the target level in response to the pulse signal.

7. The apparatus according to claim 5, further comprising a pumping voltage dividing unit configured to divide the pumping voltage and output the divided pumping voltage to the comparing unit.

8. The apparatus according to claim 5, wherein the sink unit comprises at least one switching element connected to a ground voltage terminal and configured to be turned-on when the sink signal is activated to decrease the level of the pumping voltage by connecting the pumping voltage to the ground voltage terminal.

9. An apparatus for generating a pumping voltage, the apparatus comprising:
a pumping voltage output unit configured to output a pumping voltage and configured to adjust a level of the pumping voltage to maintain a target level of the pumping voltage, wherein the level of the pumping voltage is adjusted according to a change in the level of the pumping voltage; and a release unit configured to discharge the level of the pumping voltage to be grounded when the pumping voltage reaches a predetermined excessive level which is greater than the target level by an excessive amount that is capable of causing deterioration to a gate of a transistor for receiving the pumping voltage, wherein the release unit comprises:
a comparing unit configured to detect the level of the pumping voltage, and activate a sink signal when the pumping voltage reaches the excessive level; and a main sink unit configured to decrease the level of the pumping voltage to be grounded when the sink signal is activated; and one or more subsidiary sink units configured to selectively receive the sink signal for selectively decreasing the level of the pumping voltage to be grounded at a rate faster than the rate when only the main sink unit receives the sink signal, wherein the one or more subsidiary sink units each comprises:
a switching element connected to a ground voltage terminal and configured to be turned-on when the sink signal is activated to connect the pumping voltage to the ground voltage terminal; and a switching unit connecting the switching element to the sink signal such that the switching element is selectively connectable to the sink signal by the switching unit.

10. The apparatus according to claim 9, wherein the switching unit comprises a first terminal connected to the sink signal, a second terminal connected to ground, and a third terminal connected to the switching element such that the switching element is connected to the sink signal by connecting the first terminal to the third terminal of the switching unit and is disconnected from the sink signal by connected the second terminal to the third terminal of the switching unit.

11. The apparatus according to claim 9, wherein the switching element comprises an MOS transistor having a gate connected to the switching unit.

12. The apparatus according to claim 9, wherein the pumping voltage output unit comprises:
a level detecting unit configured to detect a change in the level the pumping voltage, and configured to selectively activate a pumping enable signal according to the result of the detection;

an oscillator configured to output a pulse signal when the pumping enable signal is activated; and a charge pumping unit configured to raise the pumping voltage to the target level in response to the pulse signal.

13. The apparatus according to claim 9, further comprising a pumping voltage dividing unit configured to divide the pumping voltage and output the divided pumping voltage to the comparing unit.

14. The apparatus according to claim 9, wherein the sink unit comprises at least one switching element connected to a ground voltage terminal and configured to be turned-on when the sink signal is activated to decrease the level of the pumping voltage by connecting the pumping voltage to the ground voltage terminal.

* * * * *